(12) United States Patent
Kyushima et al.

(10) Patent No.: US 9,191,602 B2
(45) Date of Patent: Nov. 17, 2015

(54) SOLID-STATE IMAGING DEVICE INCLUDING SIGNAL CONNECTING SECTION AND SOLID-STATE IMAGING DEVICE DRIVING METHOD

(75) Inventors: Ryuji Kyushima, Hamamatsu (JP); Kazuki Fujita, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 249 days.

(21) Appl. No.: 13/979,539

(22) PCT Filed: Dec. 7, 2011

(86) PCT No.: PCT/JP2011/078325
§ 371 (c)(1),
(2), (4) Date: Jul. 12, 2013

(87) PCT Pub. No.: WO2012/098778
PCT Pub. Date: Jul. 26, 2012

(65) Prior Publication Data
US 2013/0284893 A1    Oct. 31, 2013

(30) Foreign Application Priority Data
Jan. 17, 2011  (JP) ................. 2011-006949

(51) Int. Cl.
| | |
|---|---|
| *H01L 27/00* | (2006.01) |
| *H04N 5/378* | (2011.01) |
| *H01L 27/146* | (2006.01) |
| *H04N 5/32* | (2006.01) |
| *H04N 5/343* | (2011.01) |
| *H04N 5/374* | (2011.01) |

(52) U.S. Cl.
CPC .......... *H04N 5/378* (2013.01); *H01L 27/14645* (2013.01); *H01L 27/14658* (2013.01); *H04N 5/32* (2013.01); *H04N 5/343* (2013.01); *H04N 5/3742* (2013.01)

(58) Field of Classification Search
CPC ....... H04N 5/32; H04N 5/378; H04N 5/3597; H04N 5/343; H04N 5/347; H04N 5/353; H01L 27/14658
USPC ............ 250/208.1, 214 R; 348/294–311; 378/62, 98.8, 98.9, 114–116; 257/290–292, 440
See application file for complete search history.

(56) References Cited

U.S. PATENT DOCUMENTS

| | | | |
|---|---|---|---|
| 7,525,585 B2 * | 4/2009 | Murakami et al. ............ | 348/294 |
| 2006/0044627 A1 | 3/2006 | Sato et al. | |

FOREIGN PATENT DOCUMENTS

| | | |
|---|---|---|
| JP | 9-27883 A | 1/1997 |
| JP | 2006-101479 A | 4/2006 |

(Continued)

*Primary Examiner* — Que T Le
(74) *Attorney, Agent, or Firm* — Drinker Biddle & Reath LLP

(57) ABSTRACT

A controlling section, by bringing readout switches of pixels of a certain row out of the M rows into a connected state, causes charges generated in the row to be input to integration circuits, causes first holding circuits to hold voltage values output from the integration circuits, and then brings transfer switches into a connected state to transfer the voltage values to the second holding circuits, and thereafter performs in parallel an operation for causing the voltage values to be sequentially output from the second holding circuits and an operation for, by bringing readout switches of pixels of another row into a connected state, causing charges generated in the row to be input to the integration circuits. Accordingly, a solid-state imaging device and a driving method thereof capable of suppressing variations in output characteristics, while solving the problem due to a delay effect are realized.

2 Claims, 8 Drawing Sheets

(56) References Cited

FOREIGN PATENT DOCUMENTS

| | | |
|---|---|---|
| JP | 2007-202044 A | 8/2007 |
| JP | 2008-048405 | 2/2008 |
| JP | 2010-028387 | 2/2010 |
| JP | 2010-206653 A | 9/2010 |
| WO | WO 2005/055591 | 6/2005 |

* cited by examiner

SOLID-STATE IMAGING DEVICE INCLUDING SIGNAL CONNECTING SECTION AND SOLID-STATE IMAGING DEVICE DRIVING METHOD

TECHNICAL FIELD

The present invention relates to a solid-state imaging device and a method of driving a solid-state imaging device.

BACKGROUND ART

Patent Document 1 describes a method for suppressing a delay in image readout time caused by a vertical transfer period. Moreover, Patent Document 2 describes a device that includes a correlated double sampling circuit for amplifying an image read signal and thereby attains a high-speed circuit operation.

CITATION LIST

Patent Literature

Patent Document 1: Japanese Patent Application Laid-Open No. 2007-202044
Patent Document 2: Japanese Patent Application Laid-Open No. H9-27883

SUMMARY OF INVENTION

Technical Problem

A two-dimensional flat-panel image sensor has an arrangement composed of a plurality of pixels including photodiodes formed with use of amorphous silicon. In a two-dimensional flat-panel image sensor with this arrangement, there is a problem that if the frame rate is increased, charges accumulated in the photodiodes are not entirely transferred within a predetermined transfer time, but are superimposed on a next frame of data (hereinafter, referred to as a "problem due to a delay effect").

When a rolling shutter method for sequential scanning of respective rows is adopted in a passive pixel-type arrangement, a "hold period" in which signals from the photodiodes corresponding to one row are simultaneously transferred to a signal connecting section and a "readout period" in which the held signals corresponding to several columns are read out by scanning are alternately repeated, however, if the "hold period" is shortened to increase the frame rate, a delay effect becomes remarkable, so that an image lag becomes remarkable.

Also, Patent Document 1 discloses a circuit in which a first holding section (holding circuit) and a second holding section (holding circuit) are provided in parallel with each other on each row in order to suppress a delay in image readout time caused by a vertical transfer period. Further, Patent Document 2 discloses a circuit in which two sample hold circuits (holding circuits) are provided in parallel with each other at a subsequent stage of an integration circuit. However, when holding circuits are provided in parallel, data of one row and data of another row are output by way of the different holding circuits, but the respective holding circuits have variations in output characteristics. Accordingly, even data having the same magnitude have variations depending on the holding circuits they pass through.

It is therefore an object of the present invention to provide a solid-state imaging device and a method of driving a solid-state imaging device capable of suppressing variations in output characteristics, while solving the problem due to a delay effect.

Solution to Problem

A solid-state imaging device according to the present invention includes a photodetecting section having M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, a signal connecting section including an integration circuit connected to each of the N readout wiring lines, and for outputting a voltage value according to an amount of charge input through the readout wiring line, a first holding circuit connected in series to the integration circuit, and for holding a voltage value output from the integration circuit, a second holding circuit connected in series via a transfer switch to the first holding circuit, and for holding a voltage value output from the first holding circuit, and an output switch connected to the second holding circuit, and for sequentially outputting a voltage value held in the second holding circuit, and a controlling section for controlling an opening and closing operation of the readout switches of the respective pixels and the transfer switches and controlling an output operation of voltage values in the second holding circuits by the output switches to cause voltage values according to amounts of charges generated in the photodiodes of the respective pixels to be sequentially output from the second holding circuits, and in which the controlling section, by bringing the readout switches of respective pixels that compose a certain row out of the M rows into a connected state, causes charges generated in the row to be input to the integration circuits, causes the first holding circuits to hold voltage values output from the integration circuits, and then brings the transfer switches into a connected state to transfer the voltage values to the second holding circuits, and thereafter performs in parallel an operation for causing the voltage values to be sequentially output from the second holding circuits and an operation for, by bringing the readout switches of respective pixels that compose another row out of the M rows into a connected state, causing charges generated in the row to be input to the integration circuits.

In the solid-state imaging device according to the present invention, the first holding circuit and the second holding circuit are connected in series. Accordingly, charges of a certain row out of the M rows and charges of another row are output by way of the same circuit. Consequently, variations in output characteristics can be suppressed.

Further, an operation for causing voltage values for which charges generated in the photodiodes of a certain row out of the M rows have been integrated to be sequentially output from the second holding circuits and an operation for causing charges generated in the photodiodes being components of another row out of the M rows to be input to the integration circuits are performed in parallel. By performing the two operations in parallel, input of charges from the photodiodes to the integration circuits can be performed for a longer time than that in a conventional solid-state imaging device that performs input of charges from the photodiodes to the integration circuits and output of voltage values from the holding circuits alternately, and which allows reducing charges to remain in the photodiodes. Consequently, the problem due to a delay effect can be solved.

Moreover, a method of driving a solid-state imaging device according to the present invention is a method of driving a solid-state imaging device including a photodetecting section having M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, and an integration circuit for outputting a voltage value according to an amount of charge input through the readout wiring line, and includes a first step of, by bringing the readout switches of respective pixels that compose a certain row out of the M rows into a connected state, causing charges generated in the row to be input to the integration circuits, a second step of causing first holding circuits to hold voltage values output from the integration circuits, and then transferring the voltage values to second holding circuits connected to the first holding circuits, and a third step of performing in parallel an operation for causing the voltage values held in the second holding circuits to be sequentially output from the second holding circuits and an operation for, by bringing the readout switches of respective pixels that compose another row out of the M rows into a connected state, causing charges generated in the row to be input to the integration circuits.

In the method of driving a solid-state imaging device according to the present invention, voltage values held in the first holding circuits are transferred to the second holding circuits, and then the voltage values are sequentially output from the second holding circuits. Accordingly, the voltage values corresponding to charges of a certain row out of the M rows and the voltage values corresponding to charges of another row are output by way of the same circuit. Consequently, variations in output characteristics can be suppressed.

Further, an operation for causing voltage values for which charges generated in the photodiodes of a certain row out of the M rows have been integrated to be sequentially output from the second holding circuits and an operation for causing charges generated in the photodiodes being components of another row out of the M rows to be input to the integration circuits are performed in parallel. By performing the two operations in parallel, input of charges from the photodiodes to the integration circuits can be performed for a longer time than that in a conventional driving method that performs input of charges from the photodiodes to the integration circuits and output of voltage values from the holding circuits alternately, and which allows reducing charges to remain in the photodiodes. Consequently, the problem due to a delay effect can be solved.

Advantageous Effects of Invention

The solid-state imaging device and method of driving a solid-state imaging device by the present invention can suppress variations in output characteristics, while solving the problem due to a delay effect.

DESCRIPTION OF EMBODIMENTS

Hereinafter, embodiments of the present invention will be described in detail with reference to the accompanying drawings. Also, the same components will be denoted with the same reference symbols in the description of the drawings, and overlapping description will be omitted.

Figure 1:
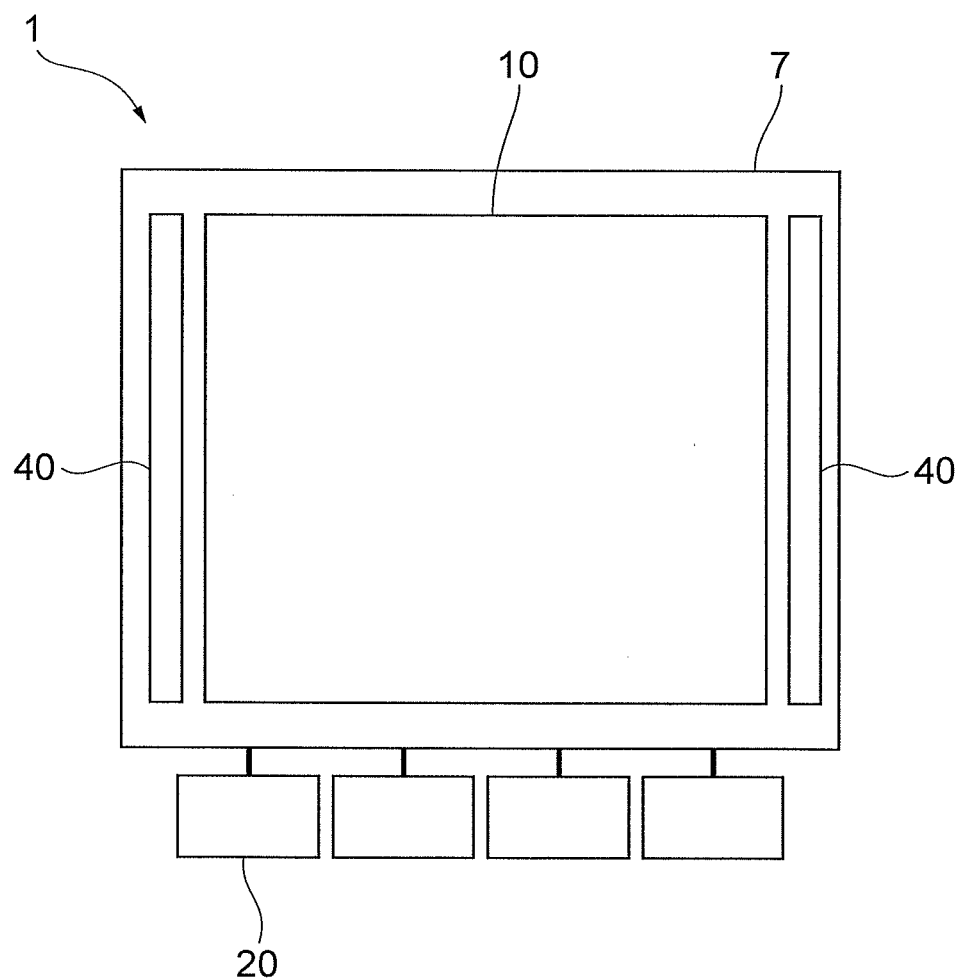
FIG. 1 is a plan view showing a configuration of a solid-state imaging device.
Figure 2:
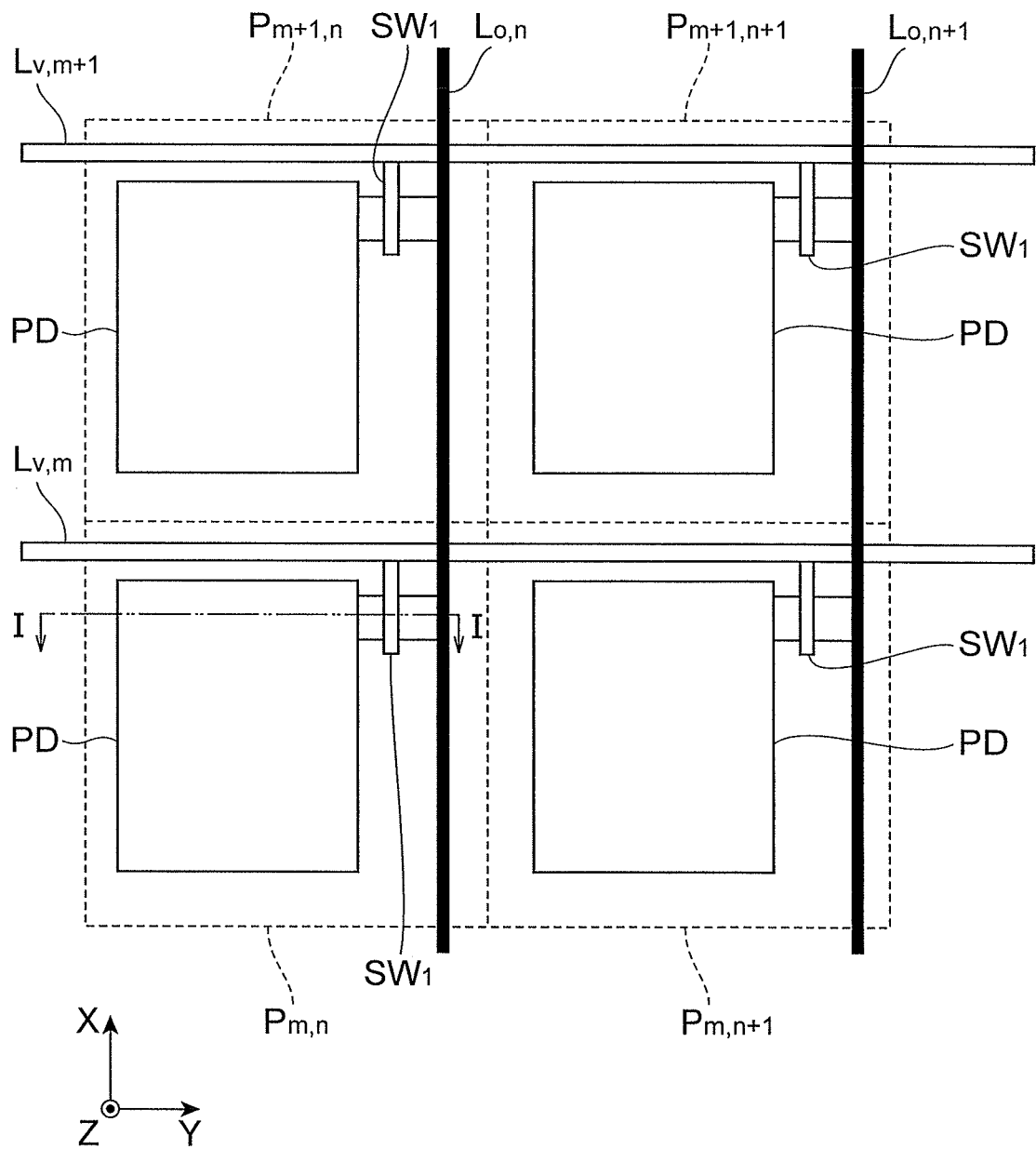
FIG. 2 is a plan view showing a configuration of a pixel part of the solid-state imaging device.
Figure 3:
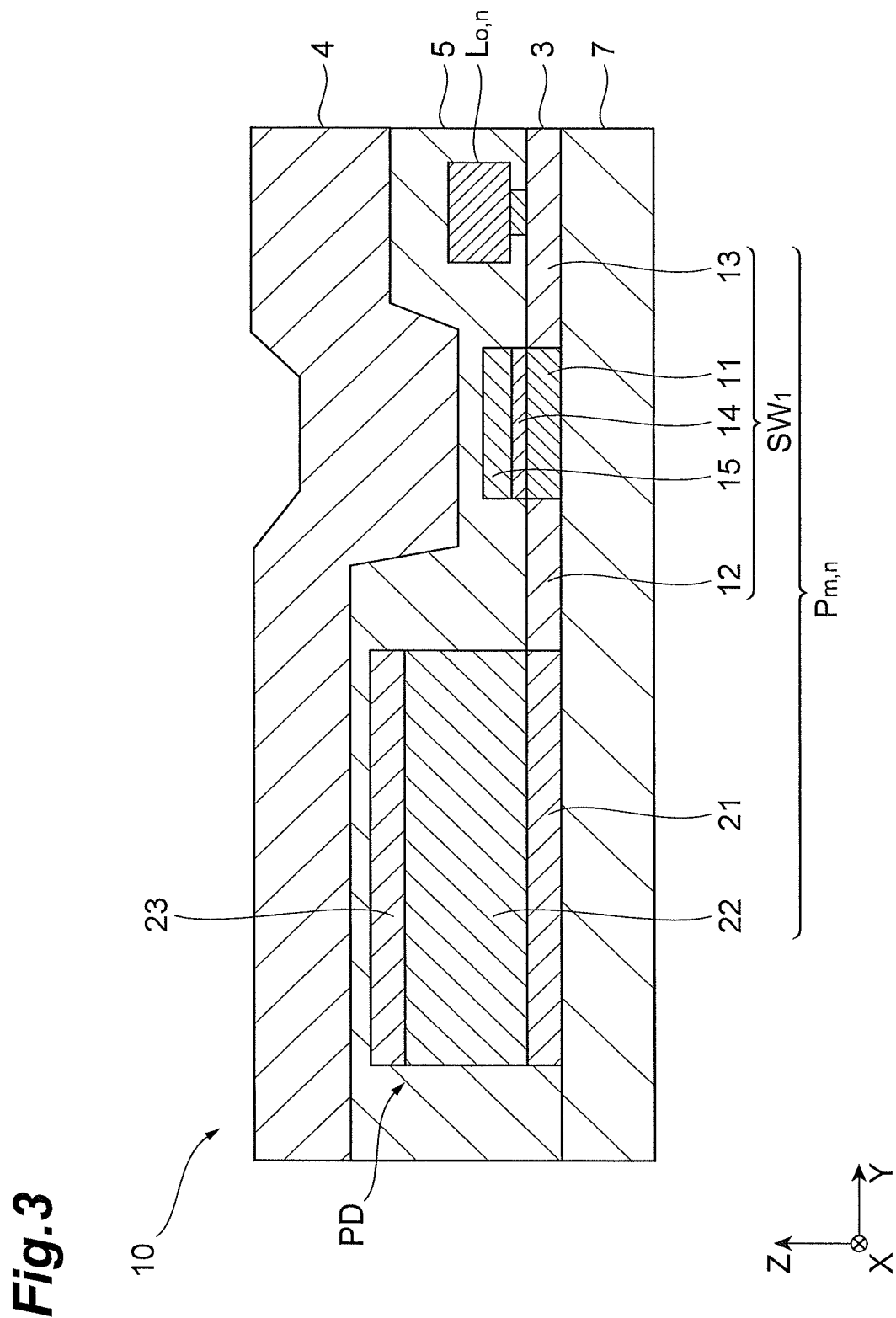
FIG. 3 is a side sectional view showing a section of the solid-state imaging device taken along a line I-I of FIG. 2.

The solid-state imaging device according to the present embodiment is used for, for example, a medical X-ray imaging system, and used particularly for a system for taking X-ray images of the jaw of a subject being tested by imaging modes such as panoramic radiography, cephalography, and CT in dentistry medical treatment. Therefore, the solid-state imaging device of the present embodiment includes thin-film transistors formed by polycrystalline silicon deposited on a large-area glass substrate, and has a remarkably wide photodetecting area as compared with that of a conventional solid-state imaging device prepared from a monocrystalline silicon wafer. FIG. 1 to FIG. 3 are views showing a configuration of the solid-state imaging device 1 of the present embodiment. FIG. 1 is a plan view showing the solid-state imaging device 1, and FIG. 2 is a partially enlarged plan view of the solid-state imaging device 1. Further, FIG. 3 is a side sectional view taken along a line I-I of FIG. 2. Also, in FIG. 1 to FIG. 3, an XYZ orthogonal coordinate system is also shown for easy understanding.

As shown in FIG. 1, the solid-state imaging device 1 includes a photodetecting section 10 built in a principal surface of a glass substrate 7, a signal connecting section 20, and a scanning shift register 40. Also, the photodetecting section 10, the signal connecting section 20, and the scanning shift register 40 may be respectively provided on separate glass substrates 7.

As shown in FIG. 2, the photodetecting section 10 is composed of M×N pixels P two-dimensionally arrayed in M rows and N columns. The pixel $P_{m,n}$ is located on the m-th row and the n-th column. Here, m is an integer not less than 1 and not more than M, and n is an integer not less than 1 and not more than N. Also, in FIG. 2, the column direction is coincident with the X-axis direction, and the row direction is coincident with the Y-axis direction. Each of M and N is an integer not less than 2. The pixel P includes a photodiode PD and a readout switch $SW_1$. To the readout switch $SW_1$, an m-th row selection wiring line $L_{V,m}$ is connected. The photodiode PD is connected to an n-th column readout wiring line $L_{O,n}$ via the readout switch $SW_1$.

Moreover, as shown in FIG. 3, the photodiode PD, the readout switch $SW_1$, and the n-th column readout wiring line $L_{O,n}$ are formed on the surface of a silicon film 3 formed on the glass substrate 7. Further, on the photodiode PD, the readout switch $SW_1$, and the n-th column readout wiring line $L_{O,n}$, a scintillator 4 is provided via an insulating layer 5. The photodiode PD is constructed containing, for example, amorphous silicon. The photodiode PD of the present embodiment includes an n-type semiconductor layer 21 made of polycrystalline silicon, an i-type semiconductor layer 22 made of amorphous silicon provided on the n-type semiconductor layer 21, and a p-type semiconductor layer 23 made of amorphous silicon provided on the i-type semiconductor layer 22. The readout switch $SW_1$ is a field effect type transistor (Field Effect Transistor, hereinafter, referred to as an "FET") formed of polycrystalline silicon, and includes a channel region 11, a source region 12 disposed along one side surface of the channel region 11, a drain region 13 disposed along the other side surface of the channel region 11, and a gate insulating film 14 and a gate electrode 15 formed on the channel region 11. The n-th column readout wiring line $L_{O,n}$ is formed of metal. The scintillator 4 generates scintillation light in response to incident X-rays to convert an X-ray image into an optical image, and outputs the optical image to the photodetecting section 10.

The polycrystalline silicon that forms the readout switch $SW_1$ is more preferably low-temperature polycrystalline silicon. The low-temperature polycrystalline silicon is polycrystalline silicon that is formed at a process temperature of 100 to 600° C. Because the range of the process temperature of 100 to 600° C. is a temperature range where alkali-free glass can be used as a substrate, it becomes possible to produce a large-area solid-state imaging device 1 on a glass substrate. The alkali-free glass is, for example, sheet glass having a thickness of 0.3 to 1.2 mm, and used as so-called glass for substrates. The alkali-free glass contains little alkali, has a low coefficient of expansion and high heat resistance, and has stable characteristics. Moreover, the mobility of a low-temperature polycrystalline silicon-based device is 10 to 600 $cm^2/Vs$, and can be made greater than the mobility (0.3 to 1.0 $cm^2/Vs$) of amorphous silicon. That is, the on-resistance can be lowered.

The pixel P as shown in FIG. 3 is produced, for example, by the following process. First, amorphous silicon is film-formed on the glass substrate 7. As the film forming method, for example, plasma CVD is favorable. Next, the amorphous silicon film is sequentially irradiated with laser beams by excimer laser annealing to make the entire surface of the amorphous silicon film into polycrystalline silicon. Thus, a silicon film 3 is formed. Then, after a $SiO_2$ film to serve as a gate insulating film 14 is formed on a partial region of this polycrystalline silicon layer, a gate electrode is formed thereon. Then, an ion implantation process is carried out for regions to be the source region 12 and the drain region 13. Subsequently, by carrying out patterning of the polycrystalline silicon layer, exposure and etching are repeatedly carried out to form electrodes and contact holes, etc. Moreover, after ions are implanted into the silicon film 3 of a region to be the pixel P so as to become n-type, i-type and p-type amorphous silicon layers (i.e. an i-type semiconductor layer 22 and a p-type semiconductor layer 23) are deposited thereon in order to form a PIN photodiode PD, and subsequently, a passivation film to serve as the insulating layer 5 is formed.

The signal connecting section 20 shown in FIG. 1 holds voltage values according to the amounts of charges output from the respective pixels P of the photodetecting section 10, and sequentially outputs the held voltage values. The scanning shift register 40 controls the respective pixels P so that charges accumulated in the respective pixels P are sequentially output to the signal connecting section 20 row by row.

Figure 4:
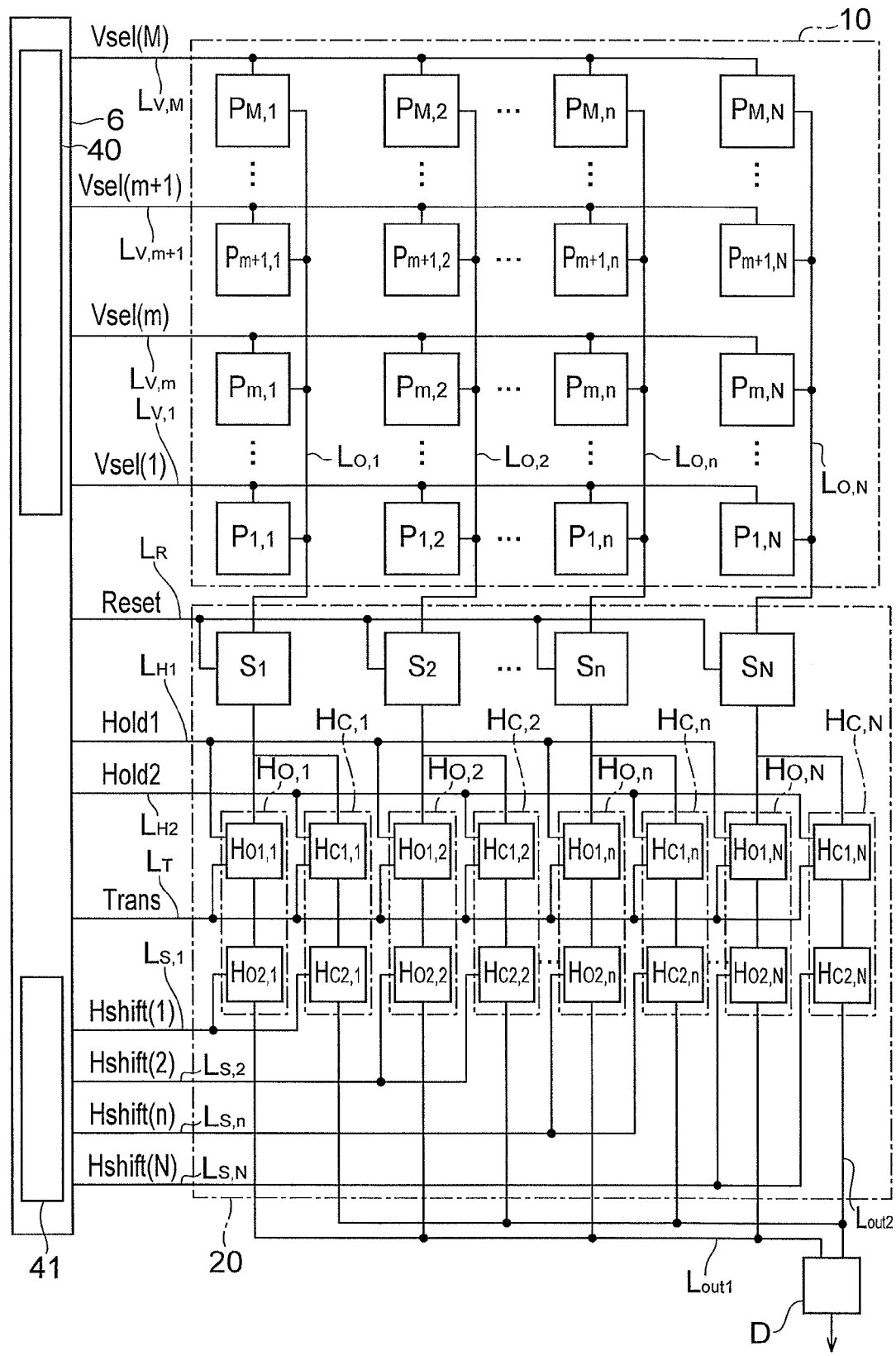
FIG. 4 is a diagram showing an internal configuration of the solid-state imaging device according to the present embodiment.

Next, a detailed configuration of the solid-state imaging device 1 according to the first embodiment will be described. FIG. 4 is a diagram showing an internal configuration of the solid-state imaging device 1. The photodetecting section 10 consists of M×N pixels $P_{1,1}$ to $P_{M,N}$ arrayed two-dimensionally in M rows and N columns. The pixel $P_{m,n}$ is located on the m-th row and the n-th column. Each of the N pixels $P_{m,1}$ to $P_{m,N}$ of the m-th row is connected with the scanning shift register 40 through the m-th row selection wiring line $L_{V,m}$. Also, in FIG. 4, the scanning shift register 40 is included in a controlling section 6. An output end of each of the M pixels $P_{1,n}$ to $P_{M,n}$ of the n-th column is connected, through the n-th column readout wiring line $L_{O,n}$, with the integration circuit $S_n$ of the signal connecting section 20.

The signal connecting section 20 includes N integration circuits $S_1$ to $S_N$, N output voltage holding sections $H_{O,1}$ to $H_{O,N}$, and N cancel voltage holding sections $H_{C,1}$ to $H_{C,N}$. The integration circuits $S_n$ have a common configuration. The output voltage holding section $H_{O,n}$ includes a first holding circuit $H_{O1,n}$ and a second holding circuit $H_{O2,n}$. The first holding circuit $H_{O1,n}$ and the second holding circuit $H_{O2,n}$ in the output voltage holding section $H_{O,n}$ are connected in series with each other. Moreover, the cancel voltage holding section $H_{C,n}$ includes a first holding circuit $H_{C1,n}$ and a second holding circuit $H_{C2,n}$. The first holding circuit $H_{C1,n}$ and the second holding circuit $H_{C2,n}$ in the cancel voltage holding section $H_{C,n}$ are connected in series with each other. The respective holding circuits have a common configuration.

The integration circuit $S_n$ has an input terminal connected to the n-th column readout wiring line $L_{O,n}$, and accumulates charges input to the input terminal, and outputs a voltage value according to the accumulated charge amount from an output terminal to the output voltage holding section $H_{O,n}$ and the cancel voltage holding section $H_{C,n}$. Each of the N integration circuits $S_1$ to $S_N$ is connected with the controlling section 6 through a reset wiring line $L_R$.

The first holding circuit $H_{O1,n}$ of the output voltage holding section $H_{O,n}$ has an input terminal connected to the output terminal of the integration circuit $S_n$, holds a voltage value input to the input terminal, and outputs the held voltage value from an output terminal to the second holding circuit $H_{O2,n}$ of the output voltage holding section $H_{O,n}$. The second holding circuit $H_{O2,n}$ has an input terminal connected to the output terminal of the first holding circuit $H_{O1,n}$, holds a voltage value input to the input terminal, and outputs the held voltage value from an output terminal to a first voltage output wiring line $L_{out1}$.

The first holding circuit $H_{C1,n}$ of the cancel voltage holding section $H_{C,n}$ has an input terminal connected to the output terminal of the integration circuit $S_n$, holds a voltage value input to the input terminal, and outputs the held voltage value from an output terminal to the second holding circuit $H_{C2,n}$ of the cancel voltage holding section $H_{C,n}$. The second holding circuit $H_{C2,n}$ has an input terminal connected to the output terminal of the first holding circuit $H_{C1,n}$, holds a voltage value input to the input terminal, and outputs the held voltage value from an output terminal to a second voltage output wiring line $L_{out2}$.

The first holding circuit $H_{O1,n}$ of the output voltage holding section $H_{O,n}$ is connected with the controlling section 6 through a hold control wiring line $L_{H1}$, and the first holding circuit $H_{C1,n}$ of the cancel voltage holding section $H_{C,n}$ is connected with the controlling section 6 through a hold control wiring line $L_{H2}$. Further, the first holding circuit $H_{O1,n}$ of the output voltage holding section $H_{O,n}$ and the first holding circuit $H_{C1,n}$ of the cancel voltage holding section $H_{C,n}$ are connected with the controlling section 6 through a transfer control wiring line $L_T$. Moreover, the second holding circuit $H_{O2,n}$ of the output voltage holding section $H_{O,n}$ and the second holding circuit $H_{C2,n}$ of the cancel voltage holding section $H_{C,n}$ are connected with a readout shift register 41 of the controlling section 6 through an n-th column selection wiring line $L_{S,n}$.

A differential circuit D has a first input terminal to be connected to the first voltage output wiring line $L_{out1}$ and a second input terminal to be connected to the second voltage output wiring line $L_{out2}$, and outputs a difference between voltage values input to the respective input terminals from an output terminal.

The scanning shift register 40 of the controlling section 6 outputs an m-th row selection control signal Vsel(m) to the m-th row selection wiring line $L_{V,m}$ to provide this m-th row selection control signal Vsel(m) to each of the N pixels $P_{m,1}$ to $P_{m,N}$ of the m-th row. M row selection control signals Vsel(1) to Vsel(M) sequentially take significant values. Moreover, the readout shift register 41 of the controlling section 6 outputs an n-th column selection control signal Hshift(n) to the n-th column selection wiring lines $L_{S,n}$ to provide this n-th column selection control signal Hshift(n) to the second holding circuits $H_{O2,n}$ and $H_{C2,n}$. N column selection control signals Hshift(1) to Hshift(N) also sequentially take significant values.

Moreover, the controlling section 6 outputs a reset control signal Reset to the reset wiring line $L_R$ to provide this reset control signal Reset to each of the N integration circuits $S_1$ to $S_N$. The controlling section 6 outputs a hold control signal Hold1 to the hold control wiring line $L_{H1}$ to provide this hold control signal Hold1 to each of the first holding circuits $H_{O1,1}$ to $H_{O1,N}$. The controlling section 6 outputs a hold control signal Hold2 to the hold control wiring line $L_{H2}$ to provide this hold control signal Hold2 to each of the first holding circuits $H_{C1,1}$ to $H_{C1,N}$. Further, the controlling section 6 outputs a transfer control signal Trans to the transfer control wiring line $L_T$ to provide this transfer control signal Trans to each of the first holding circuits $H_{O1,1}$ to $H_{O1,N}$ of the output voltage holding sections $H_{O,n}$ and the first holding circuits $H_{C1,1}$ to $H_{C1,N}$ of the cancel voltage holding sections $H_{C,n}$.

Figure 5:
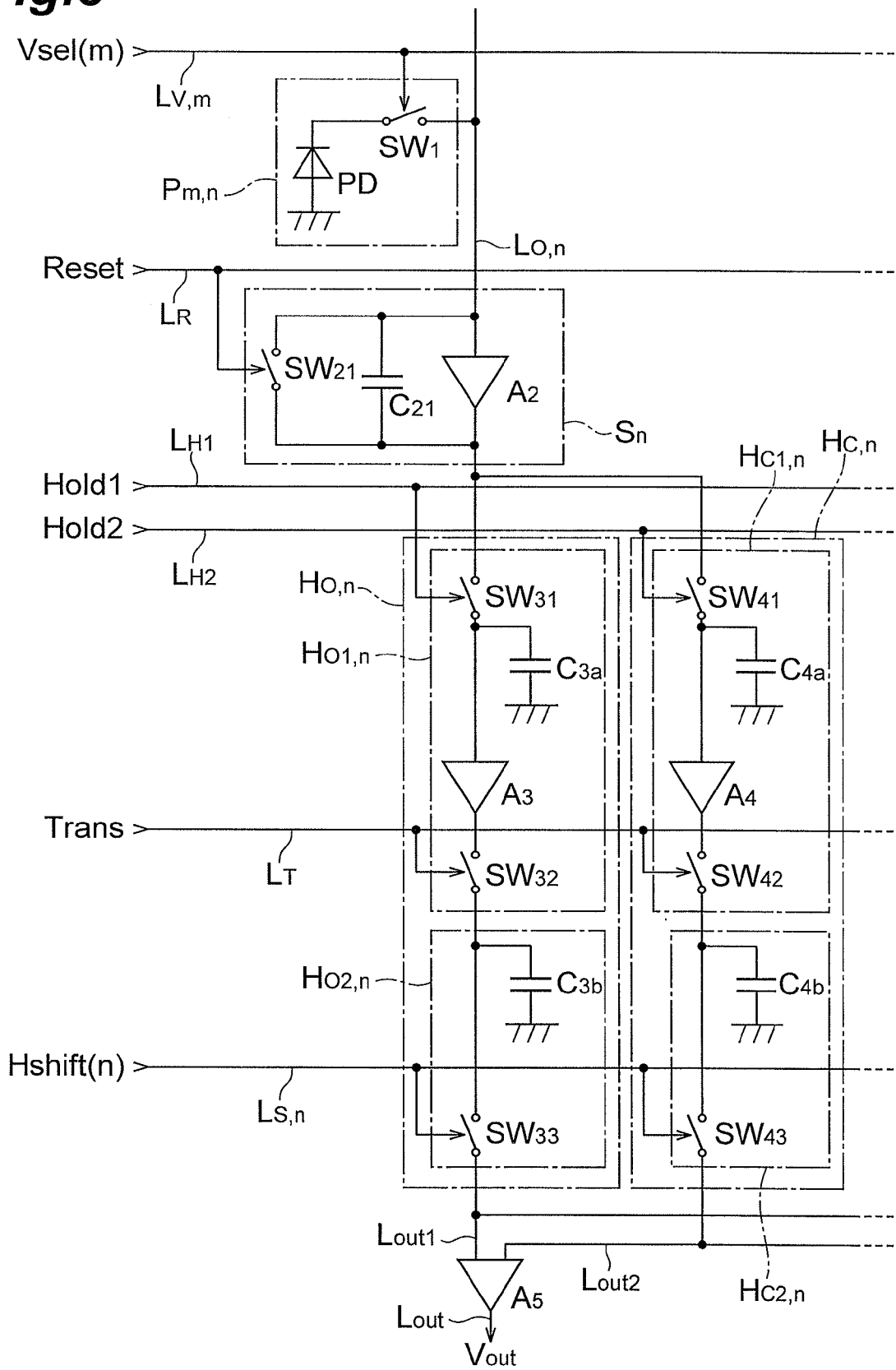
FIG. 5 is a circuit diagram of each of the pixel P, integration circuit S, and holding circuits H of the solid-state imaging device according to the present embodiment.

FIG. 5 is a circuit diagram of each of the pixel $P_{m,n}$, the integration circuit $S_n$, the first holding circuit $H_{O1,n}$ and the second holding circuit $H_{O2,n}$ in the output voltage holding section $H_{O,n}$, and the first holding circuit $H_{C1,n}$ and the second holding circuit $H_{C2,n}$ in the cancel voltage holding section $H_{C,n}$ of the solid-state imaging device 1. Here, a circuit diagram of the pixel $P_{m,n}$ is shown as a representative of the M×N pixels $P_{1,1}$ to $P_{M,N}$, a circuit diagram of the integration circuit $S_n$ is shown as a representative of the N integration circuits $S_1$ to $S_N$, a circuit diagram of the output voltage holding section $H_{O,n}$ is shown as a representative of the N output voltage holding sections $H_{O,1}$ to $H_{O,N}$, and a circuit diagram of the cancel voltage holding section $H_{C,n}$ is shown as a representative of the N cancel voltage holding sections $H_{C,1}$ to $H_{C,N}$. That is, a circuit portion relating to the pixel $P_{m,n}$ on the m-th row and the n-th column and the n-th column readout wiring line $L_{O,n}$ is shown.

The pixel $P_{m,n}$ includes a photodiode PD and a readout switch $SW_1$. The anode terminal of the photodiode PD is grounded, and the cathode terminal of the photodiode PD is connected with the n-th column readout wiring line $L_{O,n}$ via the readout switch $SW_1$. The photodiode PD generates charge of an amount according to an incident light intensity, and accumulates the generated charge in a junction capacitance section. The readout switch $SW_1$ is provided with an m-th row selection control signal Vsel(m) passed through the m-th row selection wiring line $L_{V,m}$ from the controlling section 6. The m-th row selection control signal Vsel(m) is a signal that instructs an opening and closing operation of the readout switch $SW_1$ in each of the N pixels $P_{m,1}$ to $P_{m,N}$ of the m-th row in the photodetecting section 10.

In this pixel $P_{m,n}$, when the m-th row selection control signal Vsel(m) is low level, the readout switch $SW_1$ opens, and a charge generated in the photodiode PD is not output to the n-th column readout wiring line $L_{O,n}$, but is accumulated in the junction capacitance section. On the other hand, when the m-th row selection control signal Vsel(m) is high level, the readout switch $SW_1$ closes, and the charge generated in the photodiode PD and accumulated in the junction capacitance section until then is output to the n-th column readout wiring line $L_{O,n}$ through the readout switch $SW_1$.

The n-th column readout wiring line $L_{O,n}$ is connected with the readout switch $SW_1$ of each of the M pixels $P_{1,n}$ to $P_{M,n}$ of the n-th column in the photodetecting section 10. The n-th column readout wiring line $L_{O,n}$ reads out a charge generated in the photodiode PD of any of the M pixels $P_{1,n}$ to $P_{M,n}$ via the readout switch $SW_1$ of the pixel, and transfers the charge to the integration circuit $S_n$.

The integration circuit $S_n$ includes an amplifier $A_2$, an integrating capacitive element $C_{21}$ serving as a feedback capacitance section, and a switch $SW_{21}$ (discharge switch). The integrating capacitive element $C_{21}$ and the discharge switch $SW_{21}$ are connected in parallel with each other, and provided between an input terminal and an output terminal of the amplifier $A_2$. The input terminal of the amplifier $A_2$ is connected with the n-th column readout wiring line $L_{O,n}$.

The discharge switch $SW_{21}$ is provided with a reset control signal Reset passed through the reset wiring line $L_R$ from the controlling section 6. The reset control signal Reset is a signal that instructs an opening and closing operation of the discharge switch $SW_{21}$ in each of the N integration circuits $S_1$ to $S_N$.

In this integration circuit $S_n$, when the reset control signal Reset is high level, the discharge switch $SW_{21}$ closes, the feedback capacitance section (integrating capacitive element $C_{21}$) is discharged, and a voltage value to be output from the integration circuit $S_n$ is initialized. On the other hand, when the reset control signal Reset is low level, the discharge switch $SW_{21}$ opens, a charge input to the input terminal is accumulated in the feedback capacitance section (integrating capacitive element $C_{21}$), and a voltage value according to the accumulated charge amount is output from the integration circuit $S_n$.

The first holding circuit $H_{O1,n}$ in the output voltage holding section $H_{O,n}$ includes an input switch $SW_{31}$, a transfer switch $SW_{32}$, a voltage follower $A_3$, and a holding capacitive element $C_{3a}$. One end of the holding capacitive element $C_{3a}$ is grounded. The other end of the holding capacitive element $C_{3a}$ is connected to the output terminal of the integration circuit $S_n$ via the input switch $SW_{31}$, and connected with the second holding circuit $H_{O2,n}$ in the output voltage holding section $H_{O,n}$ via the voltage follower $A_3$ and the transfer switch $SW_{32}$. The input switch $SW_{31}$ is provided with a hold control signal Hold1 passed through the hold control wiring line $L_{H1}$ from the controlling section 6. The hold control signal Hold1 is a signal that instructs an opening and closing operation of the input switch $SW_{31}$ of the first holding circuit $H_{O1,n}$ in the output voltage holding section $H_{O,n}$. The transfer switch $SW_{32}$ is provided with a transfer control signal Trans passed through the transfer control wiring line $L_T$ from the controlling section 6. The transfer control signal Trans is a signal that instructs an opening and closing operation of the transfer switch $SW_{32}$ of the first holding circuit $H_{O1,n}$ in the output voltage holding section $H_{O,n}$.

In this first holding circuit $H_{O1,n}$, when the hold control signal Hold1 switches from high level to low level, the input switch $SW_{31}$ switches from a closed state to an open state, and a voltage value being input to the input terminal at this time is held in the holding capacitive element $C_{3a}$. Moreover, when the transfer control signal Trans is high level, the transfer switch $SW_{32}$ closes, and the voltage value held in the holding capacitive element $C_{3a}$ is output to the second holding circuit $H_{O2,n}$ in the output voltage holding section $H_{O,n}$.

The second holding circuit $H_{O2,n}$ in the output voltage holding section $H_{O,n}$ includes an output switch $SW_{33}$ and a holding capacitive element $C_{3b}$. One end of the holding capacitive element $C_{3b}$ is grounded. The other end of the holding capacitive element $C_{3b}$ is connected to the output terminal of the first holding circuit $H_{O1,n}$, and connected to the first voltage output wiring line $L_{out1}$ via the output switch $SW_{33}$.

The output switch $SW_{33}$ is provided with an n-th column selection control signal Hshift(n) passed through the n-th column selection wiring line $L_{S,n}$ from the controlling section 6. The n-th column selection control signal Hshift(n) is a signal that instructs an opening and closing operation of the output switch $SW_{33}$ of the second holding circuit $H_{O2,n}$ in the output voltage holding section $H_{O,n}$.

In this second holding circuit $H_{O2,n}$, when the n-th column selection control signal Hshift(n) is high level, the output switch $SW_{33}$ closes, and a voltage value held in the holding capacitive element $C_{3b}$ is output to the first voltage output wiring line $L_{out1}$.

The first holding circuit $H_{C1,n}$ in the cancel voltage holding section $H_{C,n}$ includes an input switch $SW_{41}$, a transfer switch $SW_{42}$, a voltage follower $A_4$, and a holding capacitive element $C_{4a}$. One end of the holding capacitive element $C_{4a}$ is grounded. The other end of the holding capacitive element $C_{4a}$ is connected to the output terminal of the integration circuit $S_n$ via the input switch $SW_{41}$, and connected with the second holding circuit $H_{C2,n}$ in the cancel voltage holding section $H_{C,n}$ via the voltage follower $A_4$ and the transfer switch $SW_{42}$. The input switch $SW_{41}$ is provided with a hold control signal Hold2 passed through the hold control wiring line $L_{H2}$ from the controlling section 6. The hold control signal Hold2 is a signal that instructs an opening and closing operation of the input switch $SW_{41}$ of the first holding circuit $H_{C1,n}$ in the cancel voltage holding section $H_{C,n}$. The transfer switch $SW_{42}$ is provided with a transfer control signal Trans passed through the transfer control wiring line $L_T$ from the controlling section 6. The transfer control signal Trans is a signal that instructs an opening and closing operation of the transfer switch $SW_{42}$ of the first holding circuit $H_{C1,n}$ in the cancel voltage holding section $H_{C,n}$.

In this first holding circuit $H_{C1,n}$, when the hold control signal Hold2 switches from high level to low level, the input switch $SW_{41}$ switches from a closed state to an open state, and a voltage value being input to the input terminal at this time is held in the holding capacitive element $C_{4a}$. Moreover, when the transfer control signal Trans is high level, the transfer switch $SW_{42}$ closes, and the voltage value held in the holding capacitive element $C_{4a}$ is output to the second holding circuit $H_{C2,n}$ in the cancel voltage holding section $H_{C,n}$.

The second holding circuit $H_{C2,n}$ in the cancel voltage holding section $H_{C,n}$ includes an output switch $SW_{43}$ and a holding capacitive element $C_{4b}$. One end of the holding capacitive element $C_{4b}$ is grounded. The other end of the cancel voltage holding capacitive element $C_{4b}$ is connected to the first holding circuit $H_{C1,n}$, and connected to the second voltage output wiring line $L_{out2}$ via the output switch $SW_{43}$.

The output switch $SW_{43}$ is provided with an n-th column selection control signal Hshift(n) passed through the n-th column selection wiring line $L_{S,n}$ from the controlling section 6. The n-th column selection control signal Hshift(n) is a signal that instructs an opening and closing operation of the output switch $SW_{43}$ of the second holding circuit $H_{C2,n}$.

In this second holding circuit $H_{C2,n}$, when the n-th column selection control signal Hshift(n) is high level, the output switch $SW_{43}$ closes, and a voltage value held in the holding capacitive element $C_{4b}$ is output to the second voltage output wiring line $L_{out2}$.

The differential circuit D includes an amplifier $A_5$. A first input terminal of the amplifier $A_5$ is connected with the first voltage output wiring line $L_{out1}$ and a second input terminal is connected with the second voltage output wiring line $L_{out2}$. This amplifier $A_5$ outputs a voltage $V_{out}$ indicating a difference between two voltage values input to the input terminals to a wiring line $L_{out}$.

Figure 6:
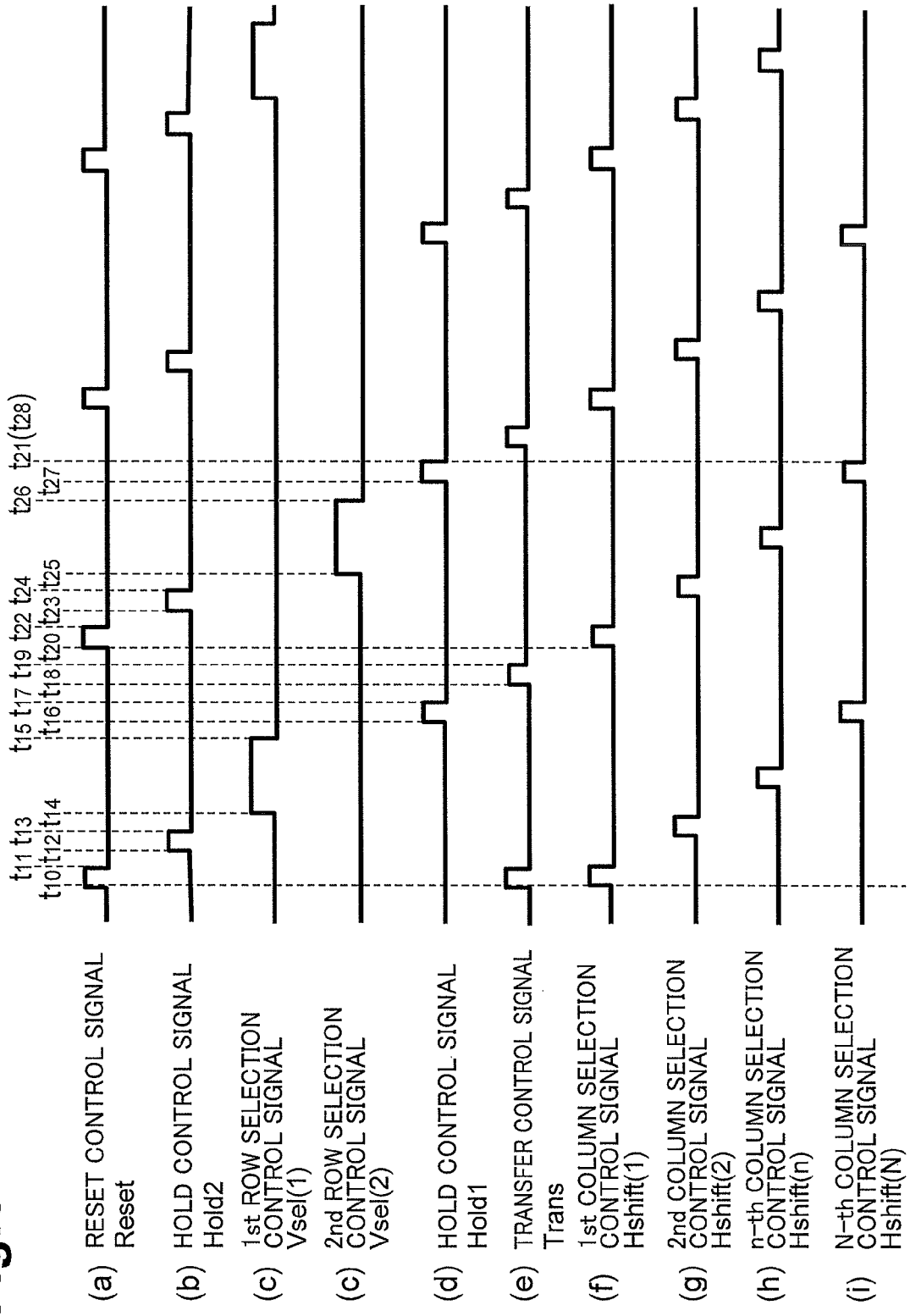
FIG. 6 is a timing chart for explaining operation of the solid-state imaging device according to the present embodiment.

The operation of the solid-state imaging device 1 according to the present embodiment is as follows. FIG. 6 is a timing chart for explaining operation of the solid-state imaging device 1 according to the present embodiment. Also, in the following, a method of driving a solid-state imaging device by the present embodiment will be described along with the operation of the solid-state imaging device 1.

FIG. 6 shows, in order from the top, (a) the reset control signal Reset for instructing an opening and closing operation of the discharge switch $SW_{21}$ in each of the N integration circuits $S_1$ to $S_N$, (b) the hold control signal Hold2 for instructing an opening and closing operation of the input switch $SW_{41}$ in each of the first holding circuits $H_{C1,1}$ to $H_{C1,N}$ of the N cancel voltage holding sections $H_{C,1}$ to $H_{C,N}$, (c) the first row selection control signal Vsel(1) and the second row selection control signal Vsel(2) for instructing an opening and closing operation of the switch $SW_1$ in each of the pixels $P_{1,1}$ to $P_{1,N}$, $P_{2,1}$ to $P_{2,N}$ of the first row and the second row in the photodetecting section 10, (d) the hold control signal Hold1 for instructing an opening and closing operation of the input switch $SW_{31}$ in each of the first holding circuits $H_{O1,1}$ to $H_{O1,N}$ of the N output voltage holding sections $H_{O,1}$ to $H_{O,N}$, and (e) the transfer control signal Trans for instructing an opening and closing operation of the transfer switch $SW_{32}$ in each of the first holding circuits $H_{O1,1}$ to $H_{O1,N}$ of the N output voltage holding sections $H_{O,1}$ to $H_{O,N}$ and the transfer switch $SW_{42}$ in each of the first holding circuits $H_{C1,1}$ to $H_{C1,N}$ of the N cancel voltage holding sections $H_{C,1}$ to $H_{C,N}$.

Moreover, FIG. 6 further goes on to show, in order, (f) the first column selection control signal Hshift(1) for instructing an opening and closing operation of the output switch $SW_{33}$ in the second holding circuit $H_{O2,1}$ of the output voltage holding section $H_{O,1}$ and the output switch $SW_{43}$ in the second holding circuit $H_{C2,1}$ of the cancel voltage holding section $H_{C,1}$, (g) the second column selection control signal Hshift(2) for instructing an opening and closing operation of the output switch $SW_{33}$ in the second holding circuit $H_{O2,2}$ of the output voltage holding section $H_{O,2}$ and the output switch $SW_{43}$ in the second holding circuit $H_{C2,2}$ of the cancel voltage holding section (h) the n-th column selection control signal Hshift(n) for instructing an opening and closing operation of the output switch $SW_{33}$ in the second holding circuit $H_{O2,n}$ of the output voltage holding section $H_{O,n}$ and the output switch $SW_{43}$ in the second holding circuit $H_{C2,n}$ of the cancel voltage holding section $H_{C,n}$, and (i) the N-th column selection control signal Hshift(N) for instructing an opening and closing operation of the output switch $SW_{33}$ in the second holding circuit $H_{O2,N}$ of the output voltage holding section $H_{O,N}$ and the output switch $SW_{43}$ in the second holding circuit $H_{C2,N}$ of the cancel voltage holding section $H_{C,N}$.

Charges generated in the photodiodes PD of the pixels $P_{1,1}$ to $P_{1,N}$ of the first row and accumulated in the junction capacitance sections are read out as follows. Before the time $t_{10}$, each of the M row selection control signals Vsel(1) to Vsel(M), the N column selection control signals Hshift(1) to Hshift(N), the reset control signal Reset, the hold control signal Hold1, the hold control signal Hold2, and the transfer control signal Trans is at low level.

<First Operation (First Step)>

During a period from the time $t_{10}$ to the time $t_{11}$, the reset control signal Reset to be output from the controlling section 6 to the reset wiring line $L_R$ becomes high level, and accordingly, in each of the N integration circuits $S_1$ to $S_N$, the discharge switch $SW_{21}$ reaches a connected state, and the integrating capacitive element $C_{21}$ is discharged. Output voltages of the integration circuits $S_1$ to $S_N$ after discharging have variations in the respective integration circuits $S_1$ to $S_N$. This is called reset noise.

During a period from the time $t_{12}$ to the time $t_{13}$ after the time $t_{11}$, the hold control signal Hold2 to be input from the controlling section 6 to the hold control wiring line $L_{H2}$ becomes high level, and accordingly, the input switches $SW_{41}$ in the first holding circuits $H_{C1,1}$ to $H_{C1,N}$ of the cancel voltage holding sections $H_{C,1}$ to $H_{C,N}$ reach a connected state. The magnitudes of output voltages of the integration circuits $S_1$ to $S_N$ after the integrating capacitive elements $C_{21}$ were discharged are held by the first holding circuits $H_{C1,1}$ to $H_{C,N}$ of the cancel voltage holding sections $H_{C,1}$ to $H_{C,N}$. Also, after the time $t_{13}$, the input switch $SW_{41}$ in each of the first holding circuits $H_{C1,1}$ to $H_{C1,N}$ of the cancel voltage holding sections $H_{C,1}$ to $H_{C,N}$ is brought into a non-connected state.

Then, during a period from the time $t_{14}$ to the time $t_{15}$ after the time $t_{13}$, the first row selection control signal Vsel(1) to be output from the controlling section 6 to the first row selection wiring line $L_{V,1}$ becomes high level, and the switch $SW_1$ in each of the N pixels $P_{1,1}$ to $P_{1,N}$ of the first row in the photodetecting section 10 reaches a connected state. Charges generated in the photodiodes PD of the respective N pixels $P_{1,1}$ to $P_{1,N}$ and accumulated in the junction capacitance sections are output to the integration circuits $S_1$ to $S_N$ through the readout switches $SW_1$ and the n-th column readout wiring lines $L_{O,1}$ to $L_{O,N}$, and accumulated in the integrating capacitive elements $C_{21}$. From the integration circuits $S_1$ to $S_N$, voltages of the magnitudes according to the amounts of charges accumulated in the integrating capacitive elements $C_{21}$ are output. Also, after the time $t_{15}$, the readout switch $SW_1$ in each of the N pixels $P_{1,1}$ to $P_{1,N}$ of the first row is brought into a non-connected state.

Then, during a period from the time $t_{16}$ to the time $t_{17}$ after the time $t_{15}$, the hold control signal Hold1 to be output from the controlling section 6 to the hold control wiring line $L_{H1}$ becomes high level, and accordingly, the input switch $SW_{31}$ reaches a connected state in each of the first holding circuits $H_{O1,1}$ to $H_{O1,N}$ of the output voltage holding sections $H_{O,1}$ to $H_{O,N}$. The magnitudes of voltages output from the integration circuits $S_1$ to $S_N$ are held by the first holding circuits $H_{O1,1}$ to $H_{O1,N}$ in the output voltage holding sections $H_{O,1}$ to $H_{O,N}$.

By the operation thus far, in the first holding circuits to $H_{C1,N}$ of the cancel voltage holding sections $H_{C,1}$ to $H_{C,N}$, voltage values output from the integration circuits $S_1$ to $S_N$ after discharging are held. Moreover, in the first holding circuits $H_{O1,1}$ to $H_{O1,N}$ of the output voltage holding sections $H_{O,1}$ to $H_{O,N}$, voltage values of the magnitudes according to the amounts of charges generated in the photodiodes PD are held. Also, the voltage values held in the first holding circuits $H_{O1,1}$ to $H_{O1,N}$ contain reset noise.

<Second Operation (Second Step)>

Then, during a period from the time $t_{18}$ to the time $t_{19}$ after the time $t_{17}$, the transfer control signal Trans to be output from the controlling section 6 to the transfer control wiring line $L_T$ becomes high level. Accordingly, the transfer switch $SW_{32}$ reaches a connected state in each of the first holding circuits $H_{O1,1}$ to $H_{O1,N}$ of the output voltage holding sections $H_{O,1}$ to $H_{O,N}$. The magnitudes of voltages output from the first holding circuits $H_{O1,1}$ to $H_{O1,N}$ of the output voltage holding sections $H_{O,1}$ to $H_{O,N}$ are held by the second holding circuits $H_{O2,1}$ to $H_{O2,N}$ of the output voltage holding sections $H_{O,1}$ to $H_{O,N}$. Moreover, in parallel with the holding operation mentioned above, the transfer switch $SW_{42}$ reaches a connected state in each of the first holding circuits $H_{C1,1}$ to $H_{C1,N}$ of the cancel voltage holding sections $H_{C,1}$ to $H_{C,N}$. The magnitudes of voltages output from the first holding circuits $H_{C1,1}$ to $H_{C1,N}$ of the cancel voltage holding sections $H_{C,1}$ to $H_{C,N}$ are held by the second holding circuits $H_{C2,1}$ to $H_{C2,N}$ of the cancel voltage holding sections $H_{C,1}$ to $H_{C,N}$.

<Third Operation (Third Step)>

During a period from the time $t_{20}$ to the time $t_{21}$ after the time $t_{19}$, the column selection control signals Hshift(1) to Hshift(N) to be output from the controlling section 6 to the column selection wiring lines $L_{S,1}$ to $L_{S,N}$ sequentially become high level for a given period, and accordingly, the output switches $SW_{33}$ of the respective N second holding circuits $H_{O2,1}$ to $H_{O2,N}$ of the output voltage holding sections $H_{O,1}$ to $H_{O,N}$ sequentially reach a connected state for the given period, so that the voltage values held in the holding capacitive elements $C_{3b}$ of the respective second holding circuits $H_{O2,1}$ to $H_{O2,N}$ are sequentially output to the first voltage output wiring line $L_{out1}$ through the output switches $SW_{33}$. Moreover, in parallel with the output operation mentioned above, the output switches $SW_{43}$ of the respective N second holding circuits $H_{C2,1}$ to $H_{C2,N}$ of the cancel voltage holding sections $H_{C,1}$ to $H_{C,N}$ sequentially reach a connected state for the given period, so that the voltage values held in the holding capacitive elements $C_{4b}$ of the respective second holding circuits $H_{C2,1}$ to $H_{C2,N}$ are sequentially output to the second voltage output wiring line $L_{out2}$ through the output switches $SW_{43}$.

That is, the voltage value held in the second holding circuit $H_{O2,n}$ of the output voltage holding section $H_{O,n}$ and the voltage value held in the second holding circuit $H_{C2,n}$ of the cancel voltage holding section $H_{C,n}$ are simultaneously output to the differential circuit D via the respective voltage output wiring lines $L_{out1}$, $L_{out2}$. Accordingly, a voltage value corresponding to reset noise can be cancelled from a composite voltage value of a voltage value corresponding to the amount of charge generated in the photodiode PD and a voltage value corresponding to reset noise, which is to be output from the output voltage holding section $H_{O,n}$.

Further, from the time $t_{20}$ after the time $t_{19}$, the foregoing first operation (first step) is carried out for charges generated in the photodiodes PD of the respective N pixels $P_{2,1}$ to $P_{2,N}$ of the second row. That is, during a period from the time $t_{20}$ to the time $t_{22}$, the reset control signal Reset to be output from the controlling section 6 to the reset wiring line $L_R$ becomes high level, and the integrating capacitive elements $C_{21}$ are discharged. Then, during a period from the time $t_{23}$ to the time $t_{24}$ after the time $t_{22}$, the hold control signal Hold2 to be input from the controlling section 6 to the hold control wiring line $L_{H2}$ becomes high level, and the magnitudes of output voltages of the integration circuits $S_1$ to $S_N$ after discharging are held by the first holding circuits $H_{C1,1}$ to $H_{C1,N}$ of the cancel voltage holding sections $H_{C,1}$ to $H_{C,N}$.

During a period from the time $t_{25}$ to the time $t_{26}$ after the time $t_{24}$, the second row selection control signal Vsel(2) to be output from the controlling section 6 to the second row selection wiring line $L_{V,2}$ becomes high level, and the switch $SW_1$ in each of the N pixels $P_{2,1}$ to $P_{2,N}$ of the second row in the photodetecting section 10 reaches a connected state. Charges generated in the photodiodes PD of the respective N pixels $P_{2,1}$ to $P_{2,N}$ and accumulated in the junction capacitance sections are output to the integration circuits $S_1$ to $S_N$ through the readout switches $SW_1$ and the readout wiring lines $L_{O,1}$ to $L_{O,N}$.

Then, during a period from the time $t_{27}$ to the time $t_{28}$ after the time $t_{26}$, the hold control signal Hold1 to be output from the controlling section 6 to the hold control wiring line $L_{H1}$ becomes high level, and voltage values output from the integration circuits $S_1$ to $S_N$ are held by the first holding circuits $H_{O1,1}$ to $H_{O1,N}$ in the output voltage holding sections $H_{O,1}$ to $H_{O,N}$. Thereafter, the second operation (second step) and the third operation (third step) described above are performed also for the second row.

Also, in the present embodiment, the time required for the third operation (third step) in the first row and the time required for the first operation (first step) in the second row are adjusted so that the time $t_{21}$ at which the N-th column selection control signal Hshift(N) in the first row falls and the time $t_{28}$ at which the hold control signal Hold1 in the second row falls are almost coincident.

In the present embodiment, as a result of the operation as in the above being sequentially performed for the first row through the M-th row, frame data indicating an image captured in one time imaging is obtained. Also, when the operation ends with respect to the M-th row, the same operation is again performed in a range from the first row to the M-th row, and frame data indicating a next image is obtained. By thus repeating the same operation with a given period, voltage values $V_{out}$ for which reset noise has been cancelled from voltage values indicating a two-dimensional intensity distribution of an optical image received by the photodetecting section 10 are output to the voltage output wiring line $L_{out}$, and the frame data is repeatedly obtained.

In the solid-state imaging device 1 and the method of driving a solid-state imaging device according to the present embodiment, the first holding circuits $H_{O1,n}$ and the second holding circuits $H_{O2,n}$ are connected in series, voltage values held in the first holding circuits $H_{O1,n}$ are transferred to the second holding circuits $H_{O2,n}$, and then the voltage values are sequentially output from the second holding circuits $H_{O2,n}$. Accordingly, the voltage values corresponding to charges of a certain row out of the M rows and the voltage values corresponding to charges of another row are output by way of the same circuit. Consequently, variations in output characteristics can be suppressed.

Moreover, in the solid-state imaging device 1 and the method of driving a solid-state imaging device according to the present embodiment, an operation for causing voltage values for which charges generated in the photodiodes PD of a certain row out of the M rows have been integrated to be sequentially output from the second holding circuits $H_{O2,n}$ and an operation for causing charges generated in the photodiodes PD being components of another row out of the M rows to be input to the integration circuits $S_n$ are performed in parallel. By performing the two operations in parallel, the time for outputting charges generated in the photodiodes PD to the integration circuits $S_n$, which is shown by the period from the time $t_{14}$ to the time $t_{15}$ in FIG. 6, can be secured long. Therefore, the problem due to a delay effect, that is, a problem that charges accumulated in the photodiodes PD are not entirely transferred within a predetermined transfer time, but are superimposed on a next frame of data, can be solved.

Moreover, in the solid-state imaging device 1 according to the present embodiment, the output voltage holding section $H_{O,n}$ for holding a voltage value for which a charge generated in the photodiode PD has been integrated and the cancel voltage holding section $H_{C,n}$ for holding a voltage value (reset noise) to be output from the integration circuit $S_n$ after discharging of the integrating capacitive element $C_{21}$ of the integration circuit $S_n$ are connected at a subsequent stage of the integration circuit $S_n$. And, the differential circuit D for subtracting the voltage value held by the cancel voltage holding section $H_{C,n}$ from the voltage value held by the output voltage holding section $H_{O,n}$ is connected at a subsequent stage of the output voltage holding section $H_{O,n}$ and the cancel voltage holding section $H_{C,n}$. By such a circuit configuration, the reset noise can be cancelled to improve the accuracy of the output voltage $V_{out}$.

Moreover, for example, when the readout switch is formed of amorphous silicon, if the frame rate is increased, a so-called memory effect, in which a charge is transiently trapped when the readout switch is brought into a non-connected state, remarkably appears. This is because amorphous silicon that is non-crystalline has a high density of levels to trap a charge in FET channels. Therefore, there is a problem that the stabilization time to release a trapped charge is required. Accordingly, as in the present embodiment, the readout switch $SW_1$ is preferably a semiconductor switch containing polycrystalline silicon. As compared with amorphous silicon, polycrystalline silicon is low in the density of trapping levels, so that the memory effect when the switch is brought into a non-connected state is less likely to occur. Consequently, the above-mentioned problem caused by the memory effect can be solved.

First Modification

Figure 7:
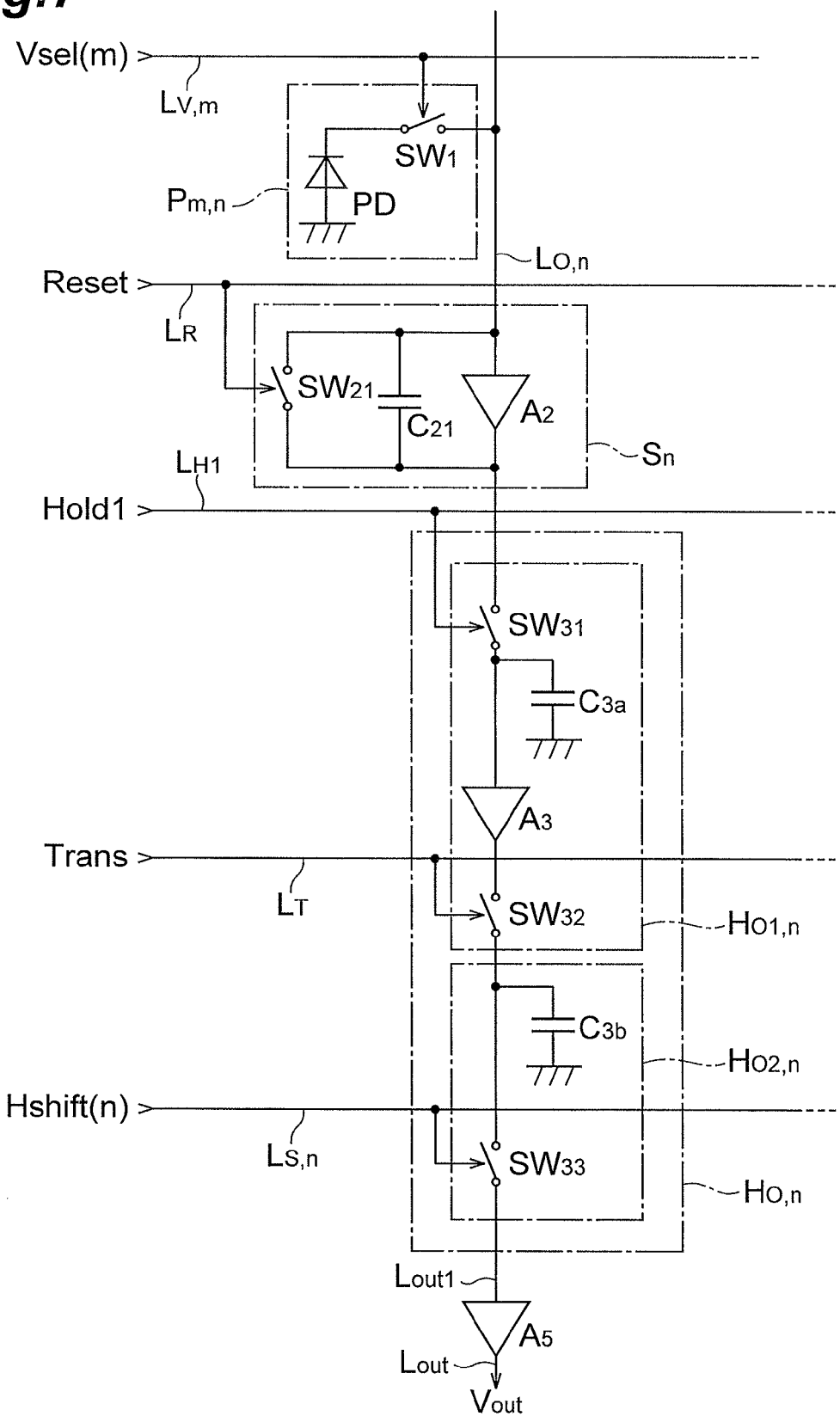
FIG. 7 is a circuit diagram showing a modification of the present embodiment.

FIG. 7 is a diagram showing a circuit configuration of a solid-state imaging device according to a first modification of the above-mentioned embodiment. The difference between the circuit shown in FIG. 7 and the circuit (refer to FIG. 5) of the above-mentioned embodiment is whether a cancel voltage holding section exists. That is, in the present modification, the cancel voltage holding section $H_{C,n}$ shown in FIG. 5 is not provided, a voltage value output from the integration circuit $S_n$ is input only to the first holding circuit $H_{O1,n}$ of the output voltage holding section $H_{O,n}$, and the amplifier $A_5$ is input with only a voltage value from the second holding circuit $H_{O2,n}$. Also, because the other aspects of the configuration are the same as those of the above-mentioned embodiment, detailed description will be omitted. By the solid-state imaging device of the present modification, the effects of the solid-state imaging device 1 of the above-mentioned embodiment excluding the cancellation of reset noise can be favorably obtained.

Second Modification

Figure 8:
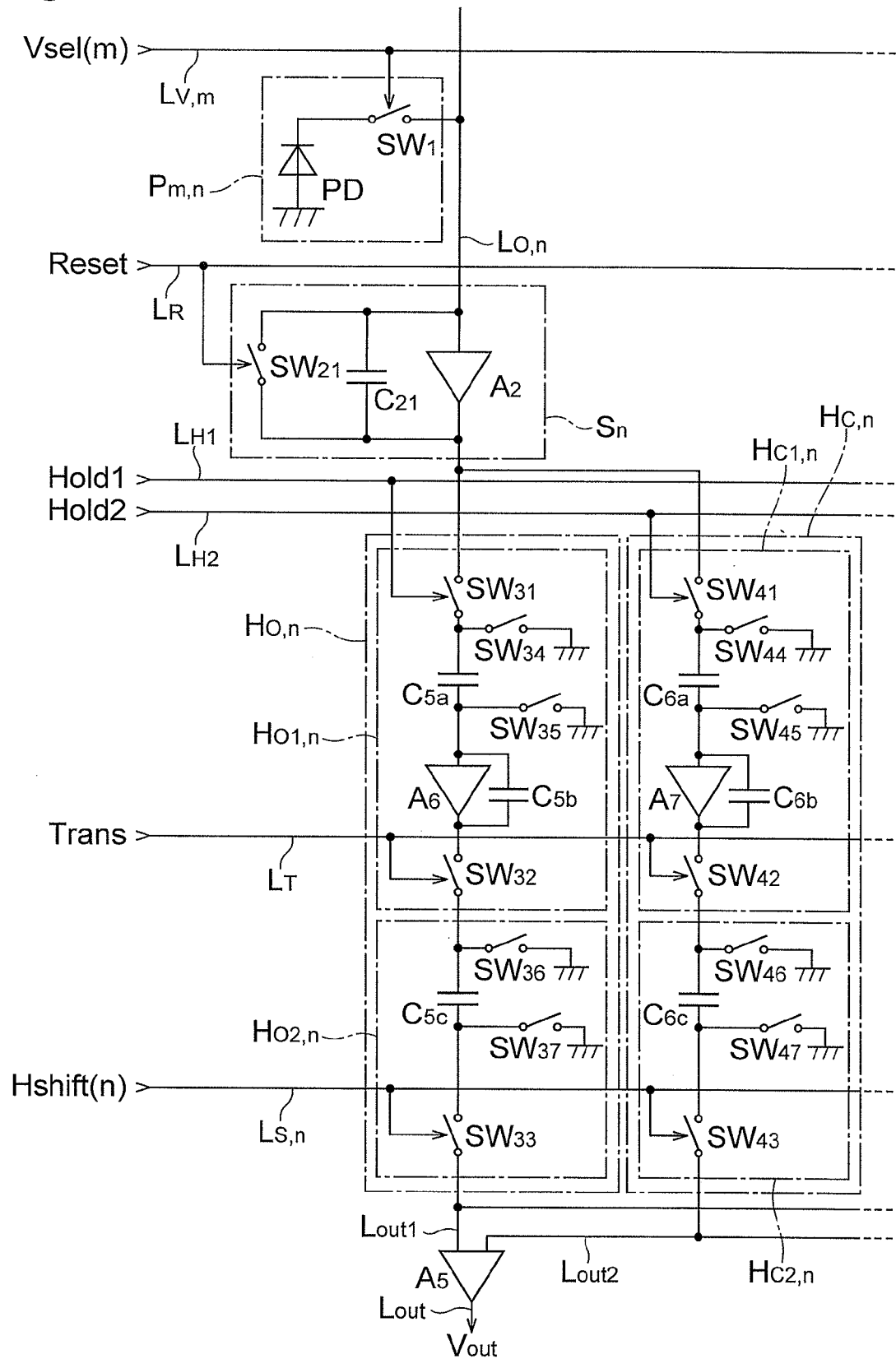
FIG. 8 is a circuit diagram showing another modification of the present embodiment.

FIG. 8 is a diagram showing a circuit configuration of a solid-state imaging device according to a second modification of the above-mentioned embodiment. The difference between the circuit shown in FIG. 8 and the circuit (refer to FIG. 5) of the above-mentioned embodiment is the configuration of the output voltage holding section and cancel voltage holding section. That is, the output voltage holding section $H_{O,n}$ and the cancel voltage holding section $H_{C,n}$ of the above-mentioned embodiment have a voltage holding type of configuration, while the output voltage holding section $H_{O,n}$ and the cancel voltage holding section $H_{C,n}$ of the present modification have a charge holding type of configuration.

Specifically, the first holding circuit $H_{O1,n}$ in the output voltage holding section $H_{O,n}$ includes an input switch $SW_{31}$, a transfer switch $SW_{32}$, a holding capacitive element $C_{5a}$, and an amplifier $A_6$ and a capacitive element $C_{5b}$ that compose an integrator. One end of the holding capacitive element $C_{5a}$ is connected to the integration circuit $S_n$ via the input switch $SW_{31}$, and the other end is connected to an input terminal of the amplifier $A_6$. An output terminal of the amplifier $A_6$ is connected to the second holding circuit $H_{O2,n}$ via the transfer switch $SW_{32}$. Also, at both ends of the holding capacitive element $C_{5a}$, switches $SW_{34}$ and $SW_{35}$ for resetting a held charge are respectively connected. Moreover, the input switch $SW_{31}$ is, in the same manner as with the above-mentioned embodiment, provided with a hold control signal Hold1 passed through the hold control wiring line $L_{H1}$ from the controlling section 6. The transfer switch $SW_{32}$ is provided with a transfer control signal Trans passed through the transfer control wiring line $L_T$ from the controlling section 6.

In this first holding circuit $H_{O1,n}$, when the hold control signal Hold1 switches from high level to low level, the input switch $SW_{31}$ switches from a closed state to an open state, and charge of an amount according to a voltage value being input to the input terminal at this time is held in the holding capacitive element $C_{5a}$. Moreover, when the transfer control signal Trans is high level, the transfer switch $SW_{32}$ closes, and a voltage value according to the charge amount held in the holding capacitive element $C_{5a}$ is output from the amplifier $A_6$ to the second holding circuit $H_{O2,n}$.

Moreover, the second holding circuit $H_{O2,n}$ of the output voltage holding section $H_{O,n}$ in the present modification includes an output switch $SW_{33}$ and a holding capacitive element $C_{5c}$. One end of the holding capacitive element $C_{5c}$ is connected to the transfer switch $SW_{32}$ of the first holding circuit $H_{O1,n}$, and the other end is connected to the first voltage output wiring line $L_{out1}$ via the output switch $SW_{33}$. Also in the second holding circuit $H_{O2,n}$, at both ends of the holding capacitive element $C_{5c}$, switches $SW_{36}$ and $SW_{37}$ for resetting a held charge are respectively connected. Moreover, the output switch $SW_{33}$ is, in the same manner as with the above-mentioned embodiment, provided with an n-th column selection control signal Hshift(n) passed through the n-th column selection wiring line $L_{S,n}$ from the controlling section 6.

In this second holding circuit $H_{O2,n}$, when the n-th column selection control signal Hshift(n) is high level, the output switch $SW_{33}$ closes, and a charge held in the holding capacitive element $C_{5c}$ is output to the first voltage output wiring line $L_{out1}$.

Moreover, the cancel voltage holding section $H_{C,n}$ has the same configuration as that of the output voltage holding section $H_{O,n}$. Specifically, the first holding circuit $H_{C1,n}$ of the cancel voltage holding section $H_{C,n}$ includes an input switch $SW_{41}$, a transfer switch $SW_{42}$, a holding capacitive element $C_{6a}$, and an amplifier $A_7$ and a capacitive element $C_{6b}$ that compose an integrator. One end of the holding capacitive element $C_{6a}$ is connected to the integration circuit $S_n$ via the input switch $SW_{41}$, and the other end is connected to an input terminal of the amplifier $A_7$. An output terminal of the amplifier $A_7$ is connected to the second holding circuit $H_{C2,n}$ via the transfer switch $SW_{42}$. At both ends of the holding capacitive element $C_{6a}$, switches $SW_{44}$ and $SW_{45}$ for resetting a held charge are respectively connected. Moreover, the input switch $SW_{41}$ is, in the same manner as with the above-mentioned embodiment, provided with a hold control signal Hold2 passed through the hold control wiring line $L_{H2}$ from the controlling section 6. The transfer switch $SW_{42}$ is provided with a transfer control signal Trans passed through the transfer control wiring line $L_T$ from the controlling section 6.

In this first holding circuit $H_{C1,n}$, when the hold control signal Hold2 switches from high level to low level, the input switch $SW_{41}$ switches from a closed state to an open state, and charge of an amount according to a voltage value being input to the input terminal at this time is held in the holding capacitive element $C_{6a}$. Moreover, when the transfer control signal Trans is high level, the transfer switch $SW_{42}$ closes, and a voltage value according to the charge amount held in the holding capacitive element $C_{6a}$ is output from the amplifier $A_7$ to the second holding circuit $H_{C2,n}$.

Moreover, the second holding circuit $H_{C2,n}$ of the cancel voltage holding section $H_{C,n}$ in the present modification includes an output switch $SW_{43}$ and a holding capacitive element $C_{6c}$. One end of the holding capacitive element $C_{6c}$ is connected to the transfer switch $SW_{42}$ of the first holding circuit $H_{C1,n}$, and the other end is connected to the second voltage output wiring line $L_{out2}$ via the output switch $SW_{43}$. At both ends of the holding capacitive element $C_{6c}$, switches $SW_{46}$ and $SW_{47}$ for resetting a held charge are respectively connected. Moreover, the output switch $SW_{43}$ is provided with an n-th column selection control signal Hshift(n) passed through the n-th column selection wiring line $L_{S,n}$ from the controlling section 6.

In this second holding circuit $H_{C2,n}$, when the n-th column selection control signal Hshift(n) is high level, the output switch $SW_{43}$ closes, and a charge held in the holding capacitive element $C_{6c}$ is output to the second voltage output wiring line $L_{out2}$.

By the solid-state imaging device of the present modification, the same effects as those of the solid-state imaging device 1 of the above-mentioned embodiment can be favorably obtained.

The solid-state imaging device and the method of driving a solid-state imaging device by the present invention are not limited to the embodiments and configuration examples mentioned above, and various other modifications can be made.

The solid-state imaging device of the above-mentioned embodiment includes a light receiving section consisting of M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, a signal connecting section including an integration circuit connected to each of the N readout wiring lines, and for outputting a voltage value according to an amount of charge input through the readout wiring line, a first holding circuit connected in series to the integration circuit, and for holding a voltage value output from the integration circuit, a second holding circuit connected in series via a transfer switch to the first holding circuit, and for holding a voltage value output from the first holding circuit, and an output switch connected to the second holding circuit, and for sequentially outputting a voltage value held in the second holding circuit, and a controlling section for controlling opening and closing operations of the readout switches of the respective pixels and the transfer switches and controlling an output operation of voltage values in the second holding circuits by the output switches to cause voltage values according to amounts of charges generated in the photodiodes of the respective pixels to be sequentially output from the second holding circuits, and is arranged such that the controlling section, by bringing the readout switches of respective pixels that compose a certain row out of the M rows into a connected state, causes charges generated in the row to be input to the integration circuits, causes the first holding circuits to hold voltage values output from the integration circuits, and then brings the transfer switches into a connected state to transfer the voltage values to the second holding circuits, and thereafter performs in parallel an operation for causing the voltage values to be sequentially output from the second holding circuits and an operation for, by bringing the readout switches of respective pixels that compose another row out of the M rows into a connected state, causing charges generated in the row to be input to the integration circuits.

Moreover, the method of driving a solid-state imaging device of the above-mentioned embodiment is a method of driving a solid-state imaging device including a light receiving section consisting of M×N (each of M and N is an integer not less than 2) pixels each including a photodiode that are arrayed two-dimensionally in M rows and N columns, N readout wiring lines arranged for each column, and connected via readout switches with the photodiodes included in the pixels of corresponding columns, and an integration circuit for outputting a voltage value according to an amount of charge input through the readout wiring line, and includes a first step of, by bringing the readout switches of respective pixels that compose a certain row out of the M rows into a connected state, causing charges generated in the row to be input to the integration circuits, a second step of causing first holding circuits to hold voltage values output from the integration circuits, and then transferring the voltage values to second holding circuits connected to the first holding circuits, and a third step of performing in parallel an operation for causing the voltage values held in the second holding circuits to be sequentially output from the second holding circuits and an operation for, by bringing the readout switches of respective pixels that compose another row out of the M rows into a connected state, causing charges generated in the row to be input to the integration circuits.

INDUSTRIAL APPLICABILITY

The present invention can be applied as a solid-state imaging device and a method of driving a solid-state imaging device capable of suppressing variations in output characteristics, while solving the problem due to a delay effect.

REFERENCE SIGNS LIST

1—solid-state imaging device, 6—controlling section, 10—photodetecting section, 20—signal connecting section, PD—photodiode, P—pixel, $SW_1$—readout switch, $SW_{31}$—input switch, $SW_{32}$—transfer switch, $SW_{33}$—output switch, $S_n$—integration circuit, $H_{O1,n}$—first holding circuit, $H_{O2,n}$—second holding circuit, $C_{21}$—integrating capacitive element, $A_2$—amplifier, $L_{O,n}$—n-th column readout wiring line.

The invention claimed is:

1. A solid-state imaging device comprising:
a photodetecting section having M×N (each of M and N is an integer not less than 2) pixels, each including a photodiode, that are arrayed two-dimensionally in M rows and N columns;
N readout wiring lines each arranged for each column, and connected via readout switches with the photodiodes included in the pixels of corresponding columns;
a signal connecting section including a plurality of integration circuits each connected to each of the N readout wiring lines, and for outputting a voltage value according to an amount of charge input through the corresponding readout wiring line, a plurality of first holding circuits each connected in series to each of the corresponding integration circuits, and for holding a voltage value output from the corresponding integration circuit, a plurality of second holding circuits each connected in series via a transfer switch to the corresponding first holding circuit, and for holding a voltage value output from the corresponding first holding circuit, and an output switch connected to the corresponding second holding circuit, and for outputting a voltage value held in the corresponding second holding circuit; and
a controlling section for controlling an opening and closing operation of the readout switches of the respective pixels and the transfer switches and controlling an output operation of voltage values in the second holding circuits by the output switches to cause voltage values according to amounts of charges generated in the photodiodes of the respective pixels to be sequentially output from the second holding circuits, wherein
the controlling section, by bringing the readout switches of respective pixels that compose a certain row out of the M rows into a connected state, causes charges generated in the row to be input to the integration circuits, causes the first holding circuits to hold voltage values output from the integration circuits, and then brings the transfer switches into a connected state to transfer the voltage values to the second holding circuits, and thereafter performs in parallel an operation for causing the voltage values to be sequentially output from the second holding circuits and an operation for, by bringing the readout switches of respective pixels that compose another row out of the M rows into a connected state, causing charges generated in the row to be input to the integration circuits.

2. A method of driving a solid-state imaging device including a photodetecting section having M×N (each of M and N is an integer not less than 2) pixels each including a photodiode, that are arrayed two-dimensionally in M rows and N columns, N readout wiring lines each arranged for each column, and connected via readout switches with the photodiodes included in the pixels of corresponding columns, and a plurality of integration circuits each for outputting a voltage value according to an amount of charge input through the corresponding readout wiring line, comprising:
a first step of, by bringing the readout switches of respective pixels that compose a certain row out of the M rows into a connected state, causing charges generated in the row to be input to the integration circuits;
a second step of causing first holding circuits to hold voltage values output from the integration circuits, and then transferring the voltage values to second holding circuits connected to the first holding circuits; and
a third step of performing in parallel an operation for causing the voltage values held in the second holding circuits to be sequentially output from the second holding circuits and an operation for, by bringing the readout switches of respective pixels that compose another row out of the M rows into a connected state, causing charges generated in the row to be input to the integration circuits.

* * * * *